(12) United States Patent
Kim

(10) Patent No.: US 7,538,484 B2
(45) Date of Patent: May 26, 2009

(54) ORGANIC ELECTRO-LUMINESCENCE DISPLAY AND MANUFACTURING METHOD THEREOF

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 272 days.

(21) Appl. No.: 10/824,364

(22) Filed: Apr. 15, 2004

(65) Prior Publication Data

US 2005/0007013 A1    Jan. 13, 2005

(30) Foreign Application Priority Data

Apr. 16, 2003   (KR) .................. 10-2003-0024103

(51) Int. Cl.
  *H01L 51/10*  (2006.01)
  *H05B 33/04*  (2006.01)
(52) U.S. Cl. .................. 313/504; 313/512; 313/292
(58) Field of Classification Search ............ 313/504, 313/506, 512, 292
See application file for complete search history.

(56) References Cited

U.S. PATENT DOCUMENTS

| | | | |
|---|---|---|---|
| 5,962,970 A * | 10/1999 | Yokoi et al. ............... | 313/506 |
| 6,383,664 B2 | 5/2002 | Bernius et al. | |
| 6,656,611 B2 * | 12/2003 | Tai et al. ................... | 428/690 |
| 6,717,357 B2 * | 4/2004 | Okuyama et al. .......... | 313/504 |
| 2004/0036411 A1 | 2/2004 | Kim et al. | |
| 2004/0140759 A1 * | 7/2004 | Park et al. ................. | 313/504 |
| 2007/0247065 A1 * | 10/2007 | Ko et al. .................... | 313/506 |

FOREIGN PATENT DOCUMENTS

| | | |
|---|---|---|
| DE | 10133684 | 2/2003 |
| EP | 0 996 314 | 4/2000 |
| GB | 2 348 050 | 9/2000 |
| JP | 2001-230073 A * | 8/2001 |
| JP | 2001230073 | 8/2001 |
| JP | 2001230073 A * | 8/2001 |
| JP | CN1329455 | 1/2002 |
| KR | 10-2001-0083584 | 9/2001 |

OTHER PUBLICATIONS

Chinese Office Action dated Mar. 28, 2008.
European Search Report dated Mar. 14, 2006.

* cited by examiner

*Primary Examiner*—Karabi Guharay
(74) *Attorney, Agent, or Firm*—Ked & Associates LLP

(57) ABSTRACT

An organic EL display panel includes a bulkhead for insulating an emitting cell from an anode strip. The emitting cell is formed from an ITO strip, a supplement electrode, an organic EL layer, an the anode strip, and at least one supplemental bulkhead. The supplemental bulkhead prevents sealant from being injected along a main bulkhead and into the emitting cell, thereby preventing an inferior device from being produced and also yield is increased.

21 Claims, 11 Drawing Sheets

ORGANIC ELECTRO-LUMINESCENCE DISPLAY AND MANUFACTURING METHOD THEREOF

CROSS-REFERENCE TO RELATED APPLICATIONS

This application claims the benefit of Korean Application No. P2003-24103, filed on Apr. 16, 2003, which is hereby incorporated by reference as if fully set forth herein.

BACKGROUND OF THE INVENTION

1. Field of the Invention

The present invention relates to a display panel, and more particularly, to an organic electro-luminescence display and a manufacturing method thereof.

Discussion of the Related Art

In recent years, a variety of a magnetic-type luminescence displays have been developed. A basic structure of the a magnetic-type luminescence display includes a horizontal array of light emitting devices for driving pixel elements. Examples of magnetic-type luminescence displays include, a VFE (Vacuum Fluorescence Display), an EL (Electro-luminescence), an LED (Light Emitting Diode), and a FED (Field Emission Display), as well as a PDP (Plasma Display Panel) having a cell as a luminescence device, the cell divided by a discharge area.

Among the magnetic-type luminescence displays, particularly, an organic EL display panel has come to be the center of attention for its ultra slim size, light weight, and full color capabilities. Organic EL display panels are able to obtain a surface luminescence with high brightness at a low voltage and RGB luminescence with a high degree of purity.

The organic EL display forms an organic layer including an emitting layer between a couple of electrodes including an anode applied to a positive voltage and a cathode applied to a negative voltage. In the organic display, by applying voltage between electrodes, an electron from cathode and a hole from anode are injected into each organic layer, and the electrode and the hole are coupled in the organic layer thereby light is emitted. The EL display panel including the organic EL device is described in reference to appended drawings.

FIG. 1 illustrates a floor plan of a conventional organic display panel. As illustrated in the drawing, the organic display panel includes a glass substrate 101, an ITO strip 102 formed in a strip form and arrayed in a line on the glass substrate, a supplement electrode 103 formed in a smaller width than the ITO strip on the ITO strip 102, an organic EL layer 104 having a hole transport layer, the emitting layer, and an electron transport layer piled on the ITO strip 102, an insulating film 106 formed between the ITO strip 102 and a bulkhead, an anode strip 105 crossing the ITO strip 102 on the organic EL layer 104 and formed in a band, a bulkhead 107 formed in the band form between the anode strips 105 for separating the neighboring anode strips 105, and a seal-cover 109 coupled to a substrate having the anode strip 105 by using a sealant 108.

In this case, the organic EL display panel is formed in a structure wherein the organic EL layer 104 is inserted between the ITO strip 102 having one higher work function and the anode strip 105 having one lower work function on the glass substrate 101. The ITO strip 102 having one higher work function is employed as an anode for injecting the hole and the anode strip 105 having one lower work function is employed as a cathode for injecting the electron.

FIG. 2A to FIG. 2F illustrates a perspective view showing an organic EL display panel in accordance with the related art. First, as illustrated in FIG. 2, a transparent ITO strip 102 is formed on the glass substrate 101 for applying the anode. In this case, an ITO strip 102-A having a short length is also formed between the bulkheads 107 for extracting the anode strip 105 with ease.

And then, as illustrated in FIG. 2B, the supplement electrode 103 is formed of such conductive metal as Mo and Cr. In this instance, if a width of the supplement electrode 103 is wider than the ITO strip 102 at a location where the sealant 108 and the supplement electrode 103 are crossed, the sealant 108 on the supplement electrode 103 is not hardened when the sealant 108 is hardened by using UV. Therefore, the width of the supplement electrode 103 at the location where the sealant 108 and the supplement electrode 103 are crossed is set narrower than the ITO strip 102 thereunder.

Subsequently, as illustrated in FIG. 2C and FIG. 2D, the ITO strip 102 further includes the insulating film 106 for insulating the bulkhead 107 from the anode strip 105. In this case, the insulating film 106 is formed in a blended form of an organic matter, an inorganic matter, and a macromolecule.

As illustrated in FIG. 2E and FIG. 2F, an organic layer 104 is formed on top of the insulating film 106 and the bulkhead 107, and then the anode strip 105 including Mg—Ag compound metal and aluminum or other conductive matter is formed. Finally, the seal-cover 109 is adhered by using the sealant 108.

FIG. 3 illustrates a floor plan showing an organic EL display panel after the glass substrate and the seal-cover are adhered by using the sealant in accordance with the related art.

As illustrated in FIG. 3, when the glass substrate 101 and the seal-cover 109 are adhered by using the sealant 108, there is a problem that the sealant 108 is injected along the bulkhead 107 into an emitting cell. The problem is described referring to FIG. 4A and FIG. 4B.

FIG. 4A illustrates a cross-sectional view of the display panel illustrated in FIG. 3 in accordance with an A direction, and FIG. 4B illustrates a cross-sectional view of the panel illustrated in FIG. 3 in accordance with a B direction.

As illustrated in the drawings, when the sealant 108 is in contact with the bulkhead 107, the sealant 108 is injected along the bulkhead 107 into the emitting cell. Then, the sealant 108-A influences the anode strip and the organic matter, thereby resulting a problem of an inferior emitting cell.

SUMMARY OF THE INVENTION

Accordingly, the present invention is directed to an organic EL (Electro-luminescence) display panel that substantially obviates one or more problems due to limitations and disadvantages of the related art.

An object of the present invention is to provide an organic EL display panel and a manufacturing method of the same for preventing a sealant from being injected along a bulkhead into an emitting cell when a glass substrate and a seal-cover is adhered by using a sealant.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, the organic EL display panel including an emitting cell having an ITO strip, a supplement electrode, an organic EL layer, and an anode strip, and a bulkhead for insulating the emitting cell from the anode strip, being characterized in, the organic EL display panel further including at least one supplement bulkhead for coupling the bulkheads.

Desirably, the supplement bulkhead is provided in an area between the emitting cell and the sealant. Desirably, the supplement bulkhead forms a predetermined angle with the bulkhead.

In another aspect of the present invention, a method of manufacturing an organic EL display panel includes the steps of forming a supplement electrode in a smaller width than ITO strip, forming an insulating film, forming a bulkhead and at least one supplement bulkhead coupling the bulkheads, forming an organic EL layer and an anode strip, and adhering the seal-cover and the glass substrate by using a sealant.

Desirably, in the fourth step of the process, the bulkhead and the supplement bulkhead are formed at the same time.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
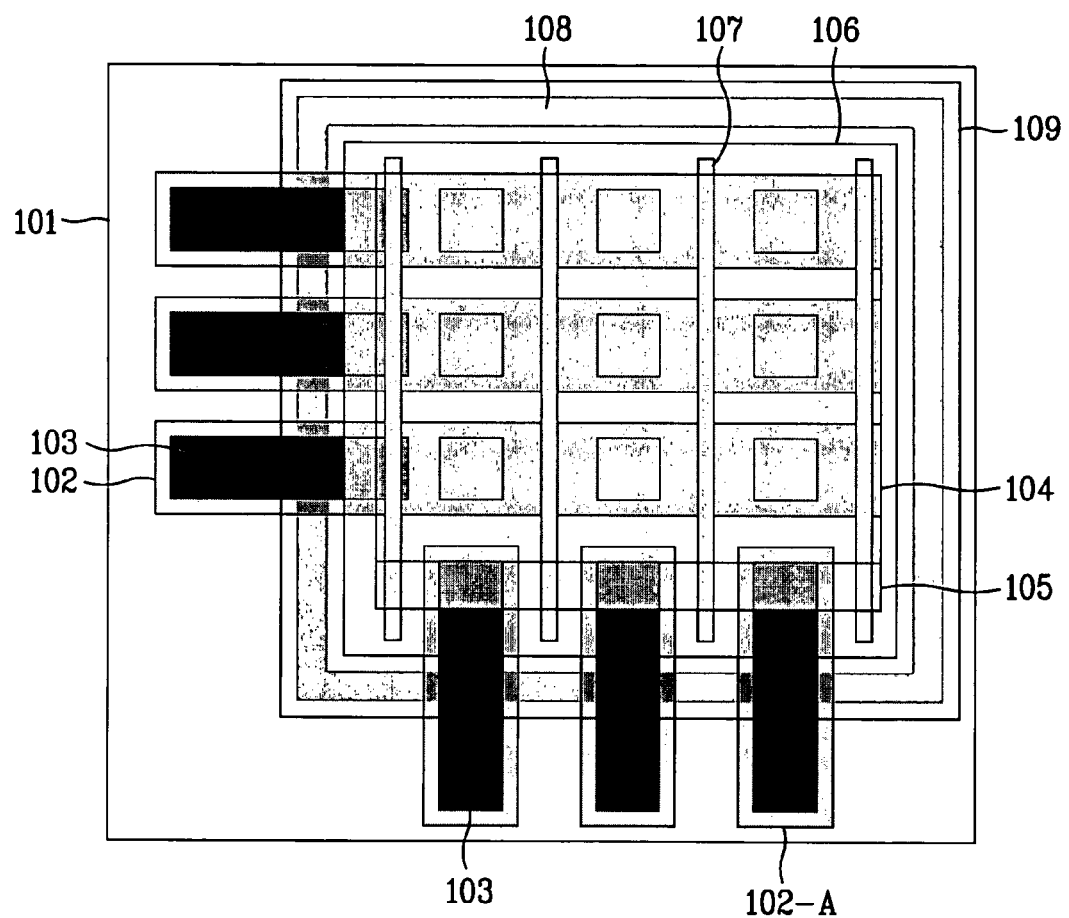
FIG. 1 illustrates a floor plan of a conventional organic display panel.
Figure 2A:
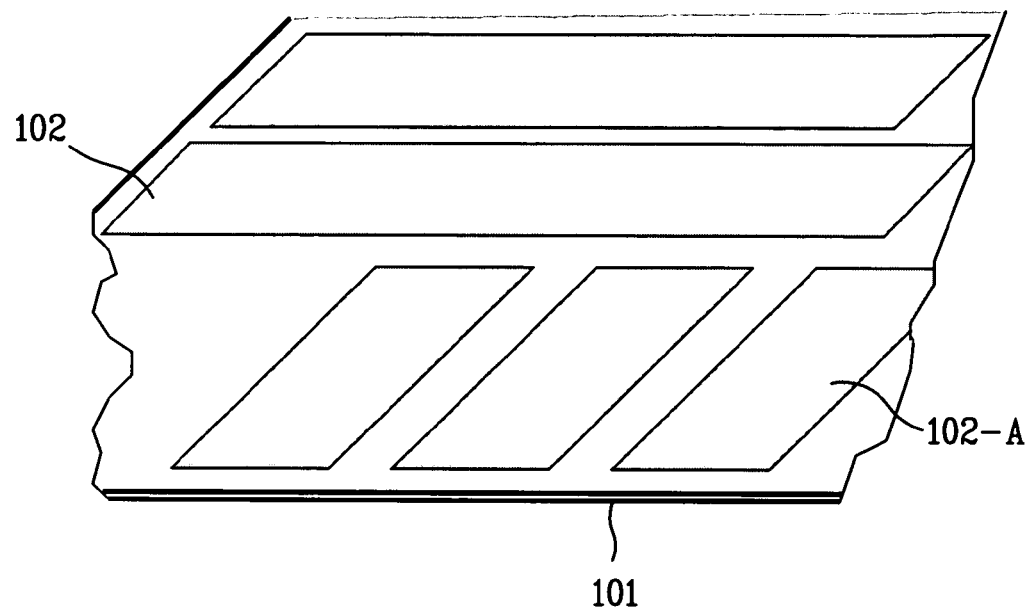
FIG. 2A to FIG. 2F illustrates a perspective view showing an organic EL display panel in accordance with a related art.
Figure 2B:
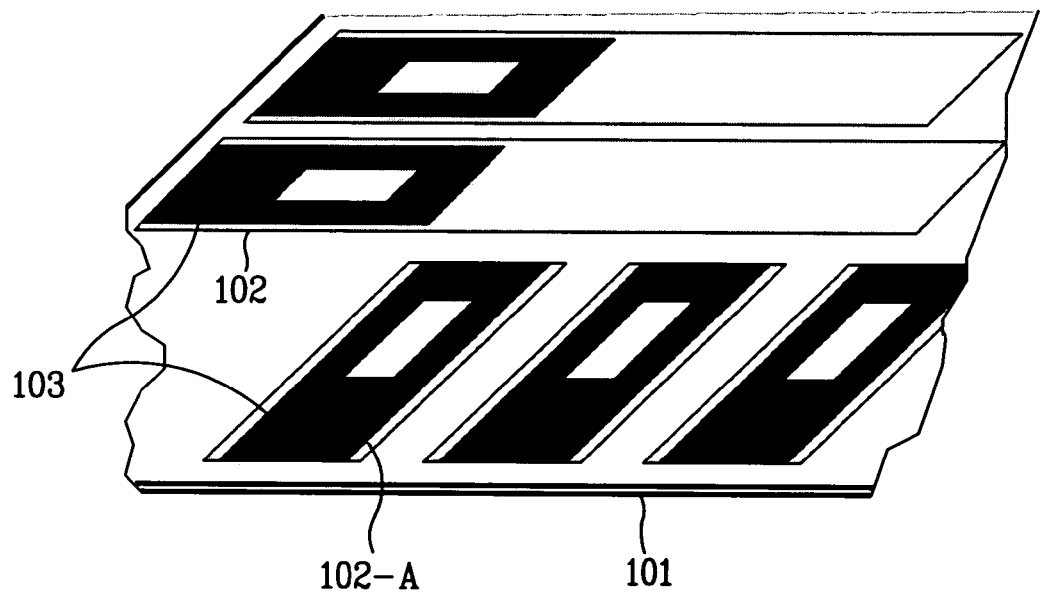
Figure 2C:
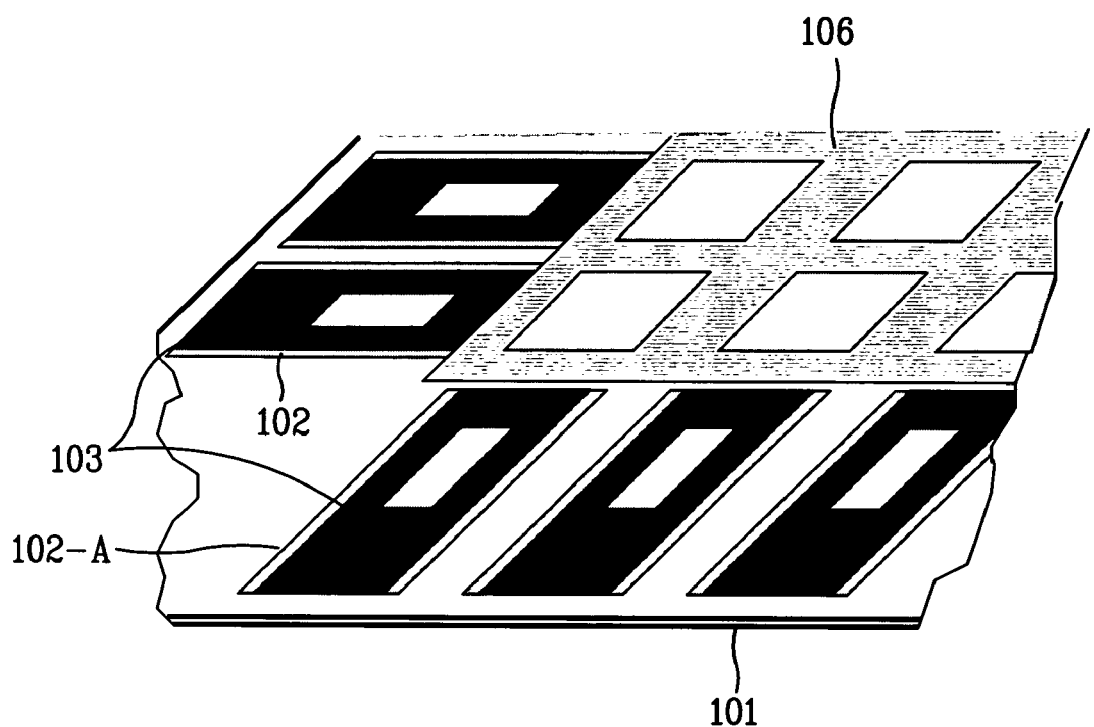
Figure 2D:
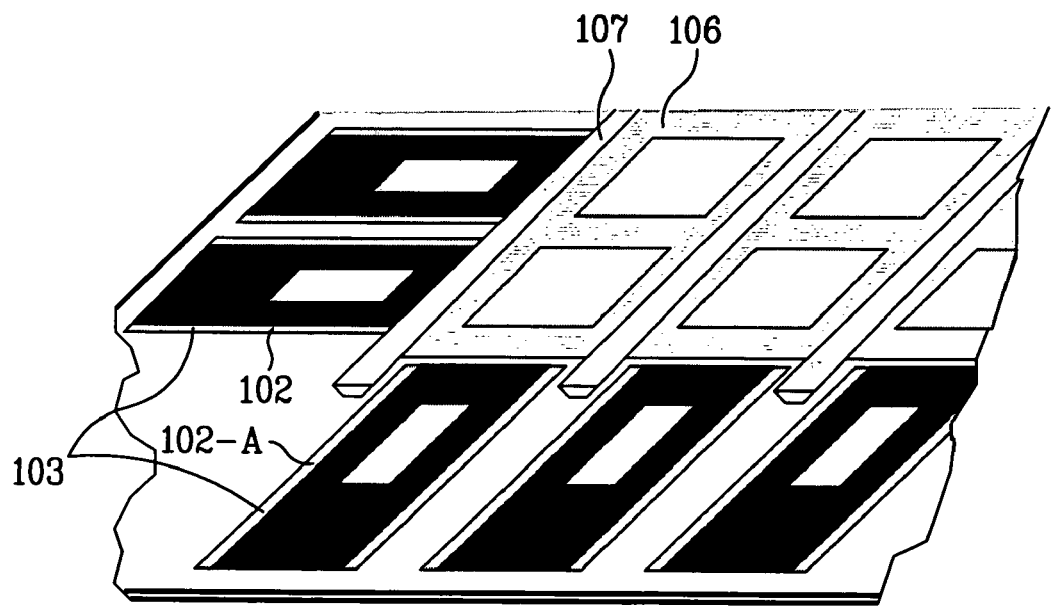
Figure 2E:
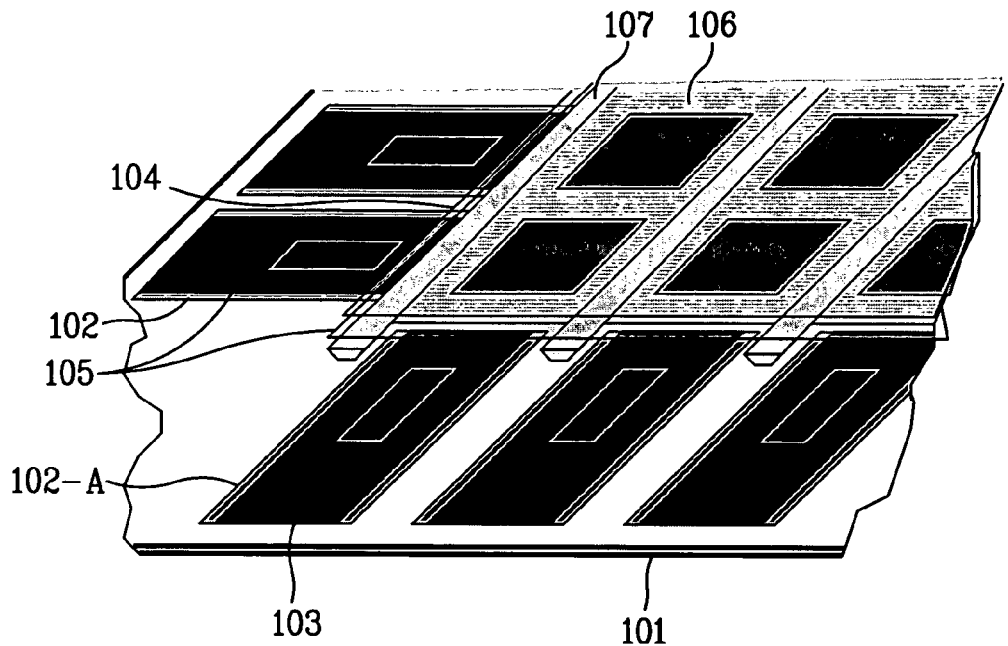
Figure 2F:
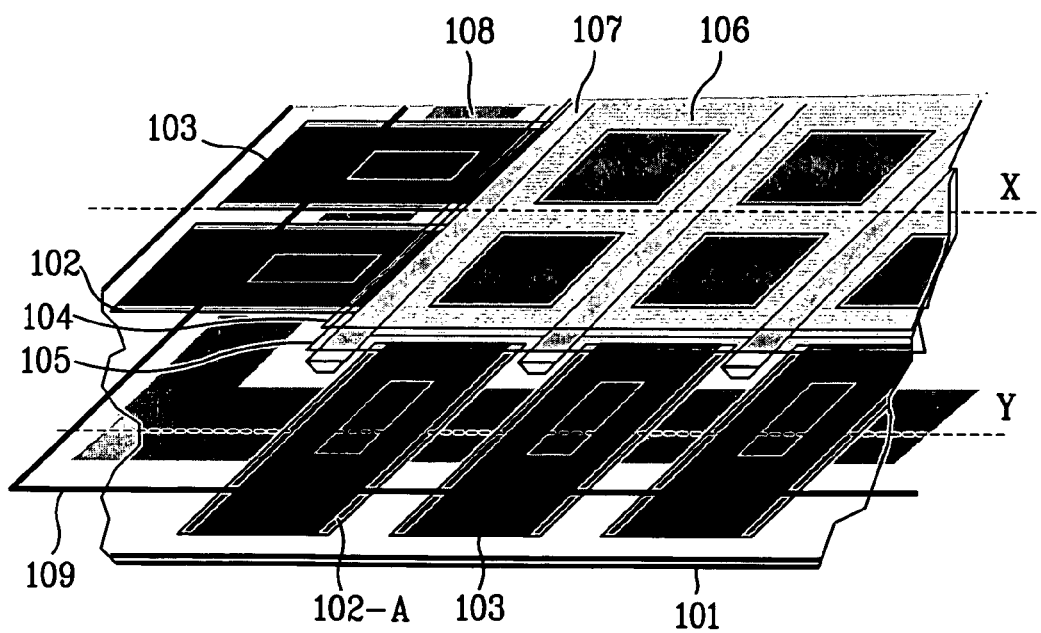
Figure 3:
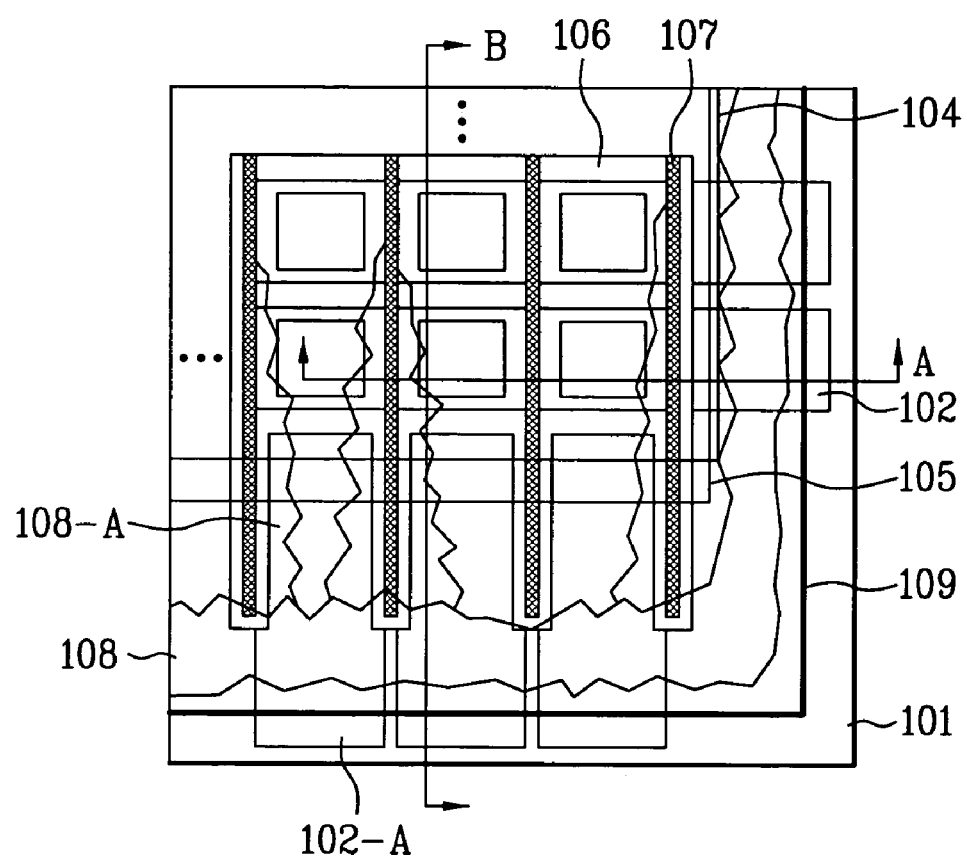
FIG. 3 illustrates a floor plan showing an organic EL display panel after a glass substrate and a seal-cover are adhered by using a sealant in accordance with a related art.
Figure 4A:
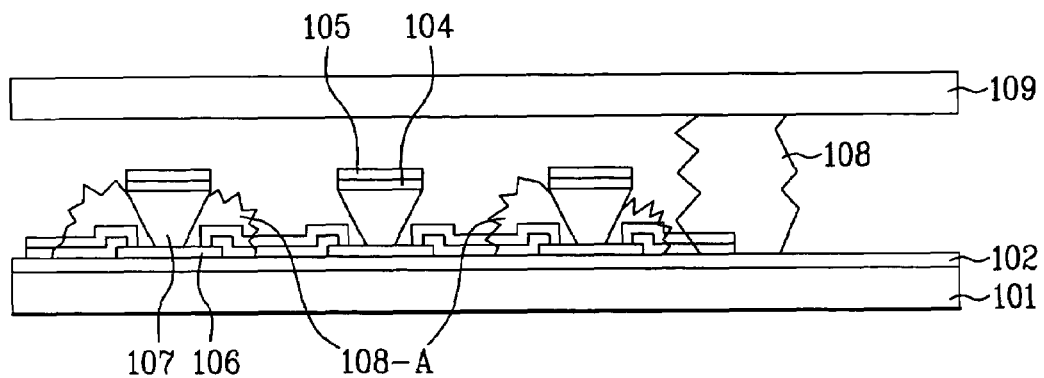
FIG. 4A illustrates a cross-sectional view of a display panel illustrated in FIG. 3 in accordance with the A direction.
Figure 4B:
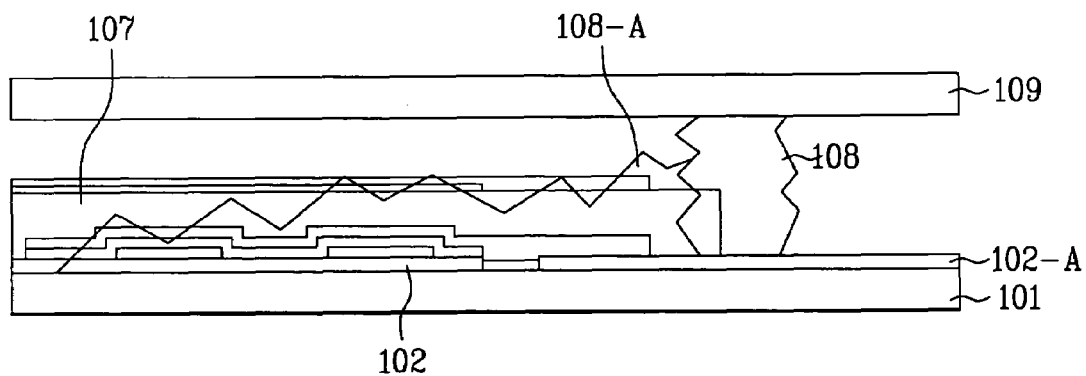
FIG. 4B illustrates a cross-sectional view of a panel illustrated in FIG. 3 in accordance with a B direction.
Figure 5A:
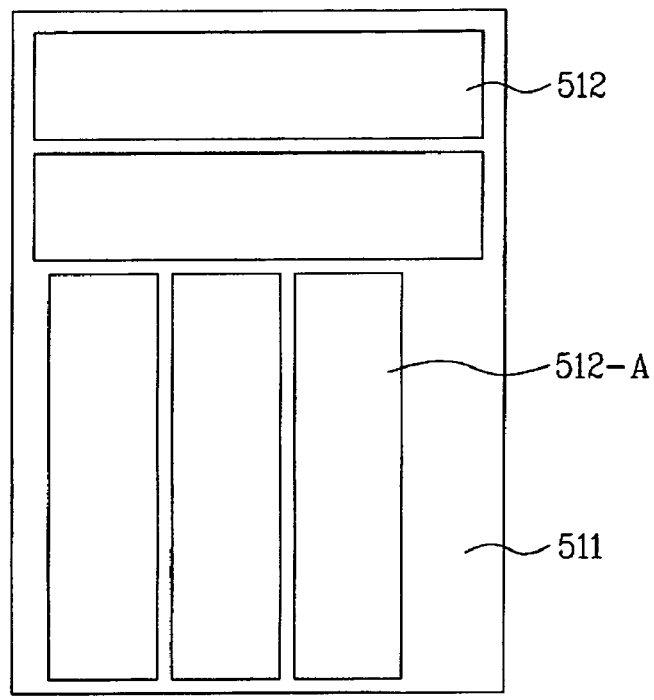
FIG. 5A to FIG. 5G illustrate a manufacturing process of an organic EL display panel in accordance with the present invention.

FIG. 5A to FIG. 5G illustrate a manufacturing process of an organic EL display panel in accordance with the present invention. First, as illustrated in FIG. 5A, an ITO strip 512 is formed on a glass substrate 511 for applying an anode. In this case, an ITO strip 512-A having a short length is formed between bulkheads to be described later at the same time to make it easier to extract an anode strip to be described later.

Figure 5B:
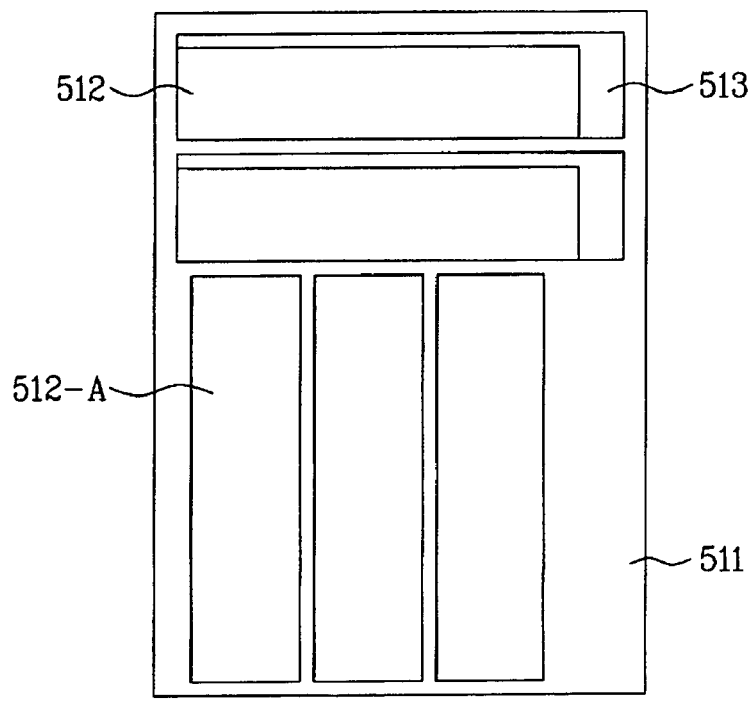

And then, as illustrated in FIG. 5B, a supplement electrode 513 is formed in a smaller width than that of the ITO strip 512 as such a conductive metal as Mo and Cr.

Figure 5C:
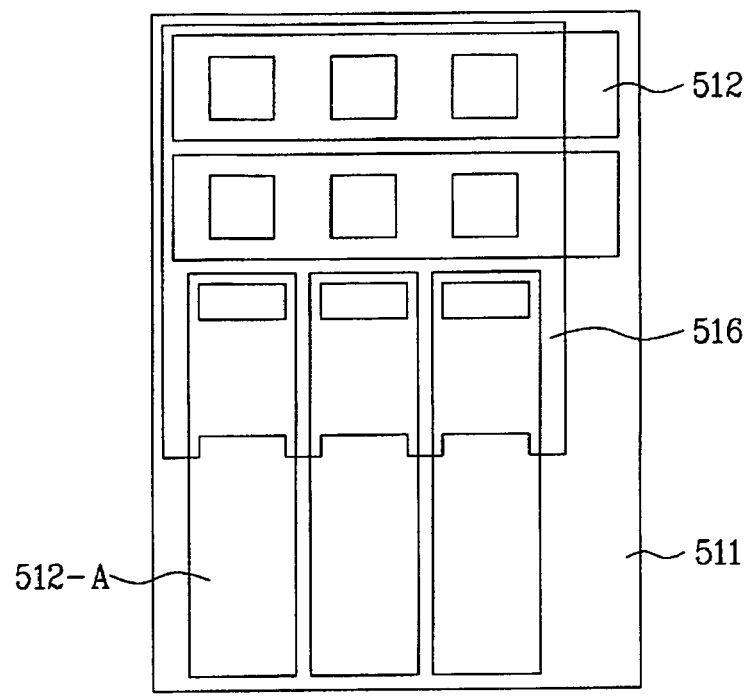

As illustrated in FIG. 5c, an insulating film 516 is further formed. In this case, the insulating film 516 is provided from a predetermined area including a location where a sealant and the supplement electrode 513 are crossed to a portion of the glass substrate 511 around an organic EL display to be described later.

Figure 5D:
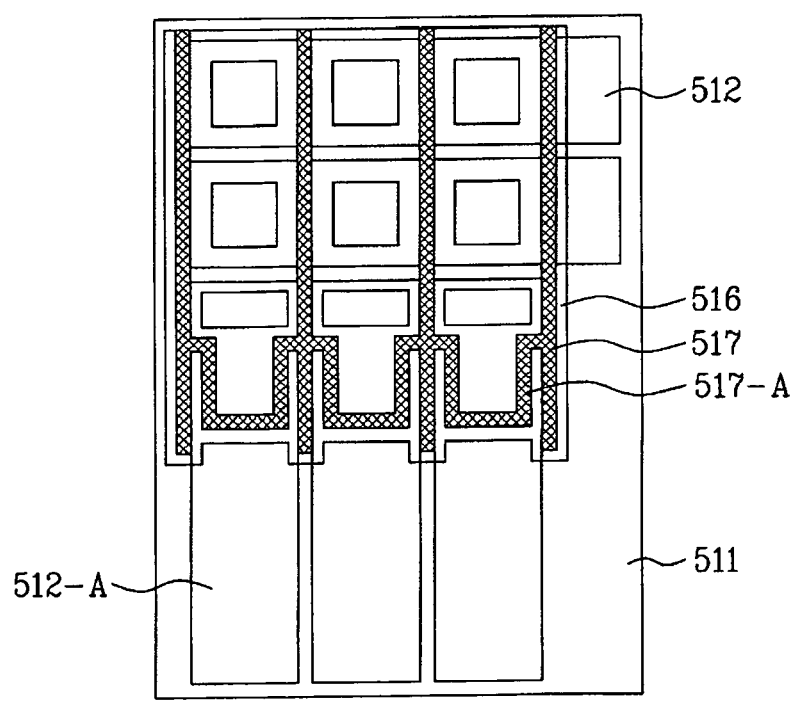

As illustrated in FIG. 5D, a bulkhead 517 electrically insulating is provided for insulating between the anode strips to be described later. In this case, a supplement bulkhead 517-A is further provided for preventing a sealant 518 from being injected along the bulkhead into an emitting cell.

Figure 6:
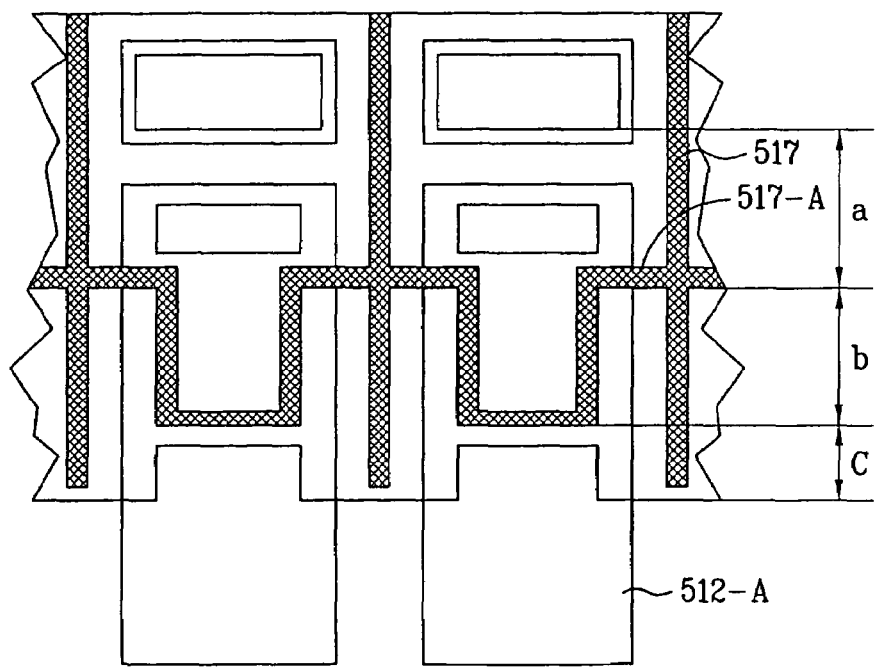
FIG. 6 illustrates a structure of a supplement bulkhead in accordance with the present invention.

In other words, as illustrated in FIG. 6, the supplement bulkhead 517-A is provided at a distance of a from the emitting cell, in a length of b, and inside at a distance of c from an end of the bulkhead 517. In this case, each of the a, b, c is set larger than 0.

Figure 7A:
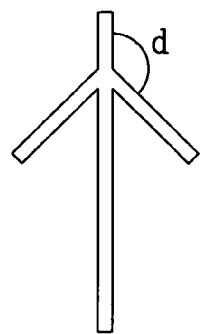
FIG. 7A to FIG. 7F illustrate various forms of supplement bulkheads in accordance with the present invention.
Figure 7B:
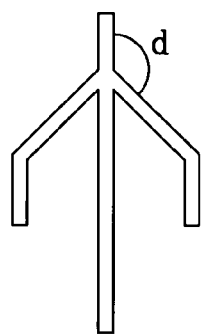
Figure 7C:
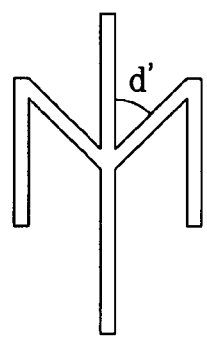

Meanwhile, the supplement bulkhead 517-A is formed in various types of forms. In other words, as illustrated in FIG. 7A to FIG. 7C, the supplement bulkhead 517-A is provided at a predetermined angle (larger than 0 and less than 180), not at a right angle. In this case, the symbols d and d' are angles between the bulkhead 517 and the supplement bulkhead 517-A.

Figure 7D:
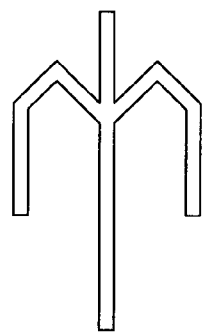
Figure 7E:
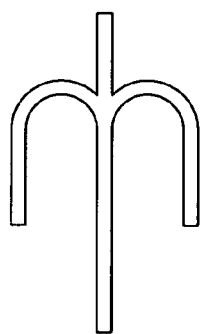
Figure 7F:
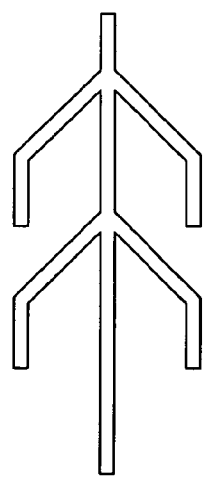

As illustrate in FIG. 7D to FIG. 7E, the supplement bulkhead 517-A may also be formed in many polygonal, circular, and oval forms. Similarly, as illustrated in FIG. 7F, the sealant is prevented by the bulkhead 517 including more than two supplement bulkheads 517-A.

Figure 5E:
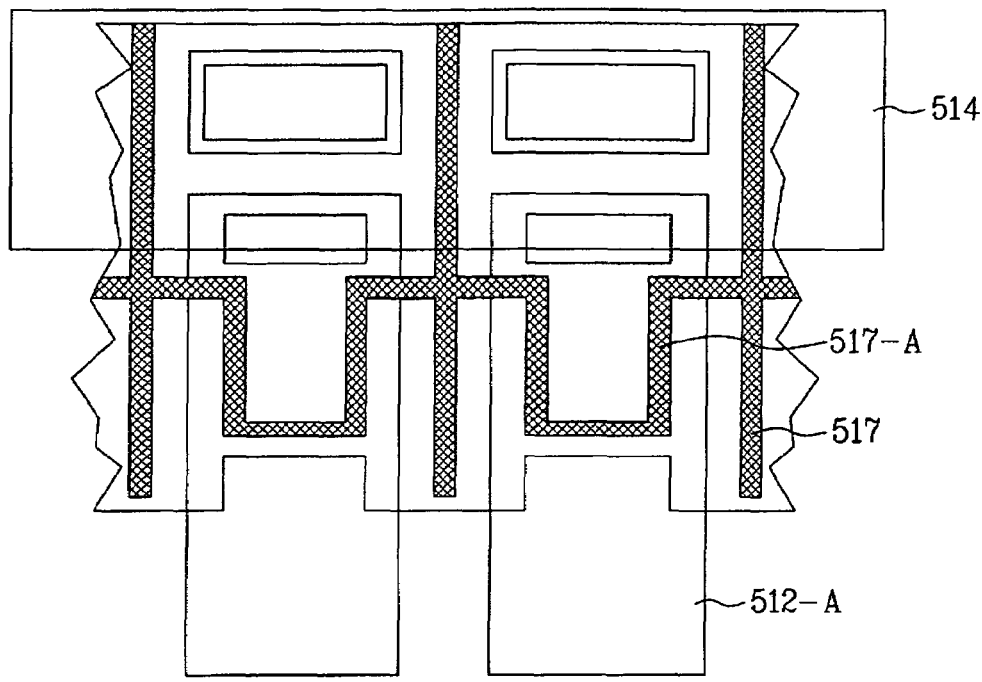
Figure 5F:
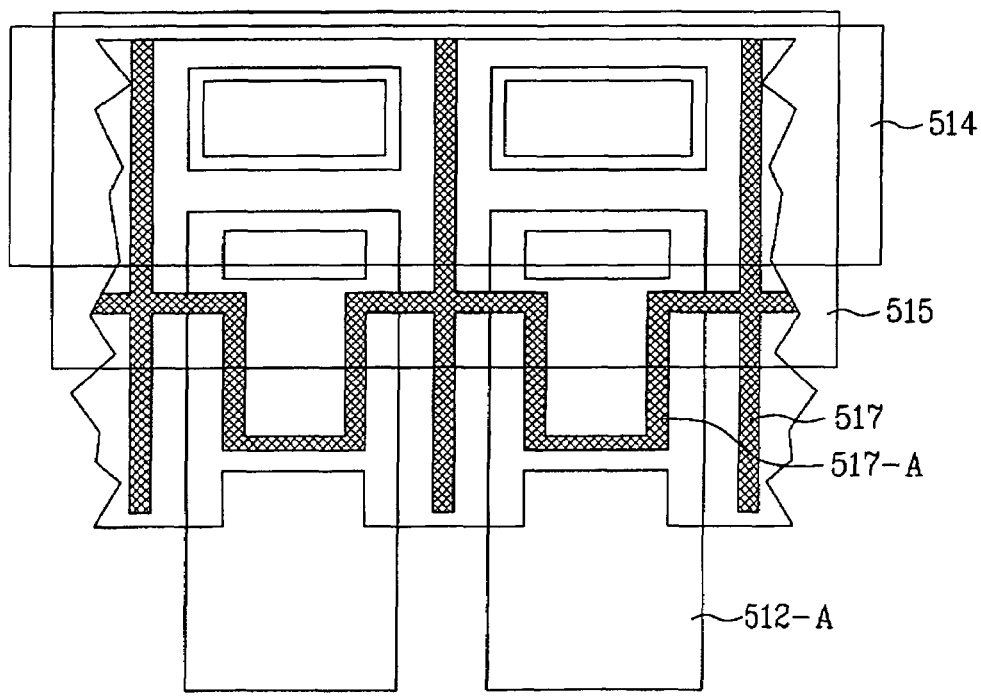

And then, as illustrated in FIG. 5E, the organic EL layer 514 including the hole transport layer, the emitting layer, and the electric transport layer is formed. The anode strip 515 including Mg—Ag compound metal, Aluminum or other conductive material is then formed as shown in FIG. 5F.

Figure 5G:
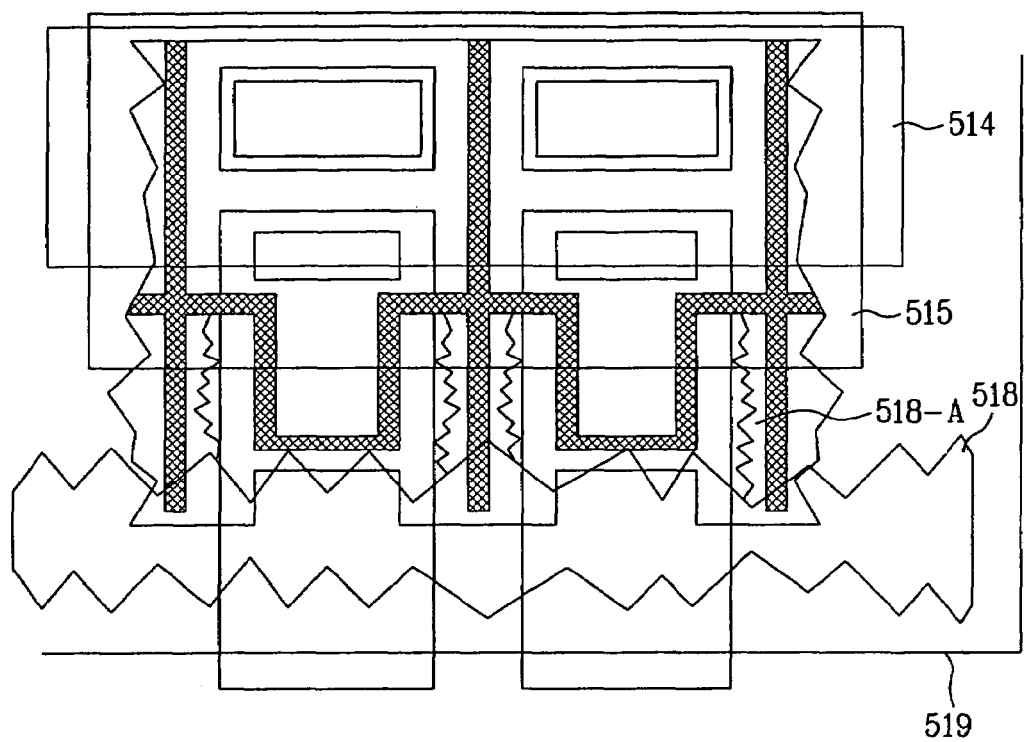

Finally, as illustrated in FIG. 5G, the seal-cover 519 is adhered by using the sealant 518 so as to complete the organic El display panel. As illustrated in the drawing, the sealant 518-A being injected along the bulkhead is stopped by the supplement bulkhead 517-A.

As described above, the organic EL display panel prevents the sealant 518 from being injected along the bulkhead 517 into the emitting cell by forming the supplement bulkhead 517-A coupling the bulkheads 517 at the end of the bulkhead thereby the inferior device is reduced and the yield is improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic EL display panel comprising:
   a sealant;
   an emitting cell comprising an anode strip, a supplement electrode, an organic EL layer, and a cathode strip;
   a bulkhead for insulating the cathode strip and an adjacent cathode strip; and
   a supplemental bulkhead for connecting adjacent bulkheads and preventing the sealant from permeating into the emitting cell, wherein the supplemental bulkhead comprises:

a first supplemental bulkhead segment coupled to a lateral face of the bulkhead at a location between an end portion of the bulkhead and the emitting cell, a second supplemental bulkhead segment coupled to an end portion of the first supplemental bulkhead segment, and a third supplemental bulkhead segment coupled to an end portion of the second supplemental bulkhead segment and another supplemental bulkhead segment coupled to a lateral face of an adjacent bulkhead, wherein a distance between an end portion of the third supplemental bulkhead segment and the emitting cell is greater than a distance between the end portion of the first supplemental bulkhead segment and the emitting cell.

2. The organic EL display panel of claim 1, wherein the supplement bulkhead is provided in an area between the emitting cell and the sealant.

3. The organic EL display panel of claim 1, wherein the supplement bulkhead forms a predetermined angle with the bulkhead.

4. The organic EL display panel of claim 1, further comprising: an insulating film formed around the organic EL layer from a predetermined area including the sealant and the supplement electrode to a portion of a glass substrate.

5. A method of manufacturing an organic EL display panel having a plurality of emitting cells, comprising:
   forming an anode strip and a supplement electrode in a smaller width than the anode strip;
   forming an insulating film;
   forming a bulkhead and at least one supplemental bulkhead coupled to at least one side portion of the bulkhead;
   forming an organic EL layer and a cathode strip; and
   adhering a seal-cover and a glass substrate by using a sealant, wherein the supplement bulkhead comprises:
      a first supplemental bulkhead segment coupled to a lateral face of the bulkhead at a location between an end portion of the bulkhead and the emitting cell,
      a second supplemental bulkhead segment coupled to an end portion of the first supplemental bulkhead segment, and
      a third supplemental bulkhead segment coupled to an end portion of the second supplemental bulkhead segment and another supplemental bulkhead segment coupled to a lateral face of an adjacent bulkhead, wherein a distance between an end portion of the third supplemental bulkhead segment and the emitting cell is greater than a distance between the end portion of the first supplemental bulkhead segment and the emitting cell.

6. The method of claim 5, further comprising:
   forming a short anode strip that is shorter than the anode strip between the bulkhead and at least one other bulkhead.

7. The method of claim 5, wherein the insulating film is formed around the organic EL layer from a predetermined area including a sealant and the supplement electrode to a portion of the glass substrate.

8. The method of claim 5, wherein the bulkhead and the supplement bulkhead are formed at a same time.

9. An organic EL display panel having a plurality of emitting cells comprising:
   a plurality of bulkheads for insulating the plurality of emitting cells; and
   a supplemental bulkhead for connecting adjacent bulkheads and preventing a sealant from permeating into at least one of the emitting cells, wherein the supplemental bulkhead comprises:
      a first supplemental bulkhead segment coupled to a lateral face of the bulkhead at a location between an end portion of the bulkhead and the emitting cell,
      a second supplemental bulkhead segment coupled to an end portion of the first supplemental bulkhead segment, and
      a third supplemental bulkhead segment coupled to an end portion of the second supplemental bulkhead segment and another supplemental bulkhead segment coupled to a lateral face of an adjacent bulkhead, wherein a distance between an end portion of the tbird supplemental bulkhead segment and the emitting cell is greater than a distance between the end portion of the first supplemental bulkhead segment and the emitting cell.

10. The organic EL display panel of claim 9, wherein the supplemental bulkhead is located in a region between adjacent bulkheads and a region between the emitting cells and a sealant.

11. The organic EL display panel of claim 9, wherein the supplemental bulkhead is formed perpendicular to at least one of the adjacent bulkheads.

12. The organic EL display panel of claim 9, wherein the supplemental bulkhead includes three segments.

13. The organic EL display panel of claim 9, wherein the supplemental bulkhead comprises:
   a first supplemental bulkhead segment perpendicular to and connected with at least one of the bulkheads;
   a second supplemental bulkhead segment parallel to said at least one of the bulkheads and connected with the first supplemental bulkhead segment; and
   a third supplemental bulkhead segment perpendicular to said at least one of the bulkheads and connected with the second supplemental bulkhead segment.

14. The organic EL display panel of claim 9, wherein the supplemental bulkhead comprises:
   a first supplemental bulkhead segment formed at a first predetermined angle with and connected to at least one of the bulkheads;
   a second supplemental bulkhead segment parallel to said at least one of the bulkheads and connected with the first supplemental bulkhead segment; and
   a third supplemental bulkhead segment formed at a second predetermined angle with said at least one of the bulkheads and connected with the second supplemental bulkhead segment.

15. The organic EL display panel of claim 9, wherein the supplemental bulkhead comprises:
   a first supplemental bulkhead segment curved to and connected with at least one of the bulkheads;
   a second supplemental bulkhead segment parallel to said at least one of the bulkheads and connected with the first supplemental bulkhead segment; and
   a third supplemental bulkhead segment curved to said at least one of the bulkheads and connected with the second supplemental bulkhead segment.

16. A method of manufacturing an organic EL display panel having a plurality of emitting cells, the method comprising:
   forming a plurality of anode strips on a substrate;
   forming an insulating film in a region other than an emitting cell region;
   forming a plurality of bulkheads on the insulating film and a supplemental bulkhead connecting adjacent ones of the bulkheads; and forming an organic EL layer and a cathode strip in the emitting cell region, wherein the supplemental bulkhead comprises:
- a first supplemental bulkhead segment coupled to a lateral face of the bulkhead at a location between an end portion of the bulkhead and the emitting cell,
- a second supplemental bulkhead segment coupled to an end portion of the first supplemental bulkhead segment, and
- a third supplemental bulkhead segment coupled to an end potion of the second supplemental bulkhead segment and another supplemental bulkhead segment coupled to a lateral face of an adjacent bulkhead, wherein a distance between an end portion of the third supplemental bulkhead segment and the emitting cell is greater than a distance between the end portion of the first supplemental bulkhead segment and the emitting cell.

17. The method of claim 16, wherein the plurality of bulkheads and the supplemental bulkhead are formed at a same time.

18. An organic EL display panel comprising:
an emitting cell between two bulkheads; and
a supplemental bulkhead for connecting two bulkheads, wherein the supplemental bulkhead includes a second supplemental bulkhead segment connecting a first supplemental bulkhead segment and a third supplemental bulkhead segment, wherein a distance between the third supplemental bulkhead segment and the emitting cell is greater than a distance between the first supplemental bulkhead segment and the emitting cell, wherein the first supplemental bulkhead segment is coupled to a lateral face of the bulkhead at a location between an end portion of the bulkhead and the emitting cell.

19. The organic EL display panel of claim 18, wherein the first supplemental bulkhead segment is coupled to two bulkheads, respectively, the second supplemental bulkhead is coupled to an end portion of the first supplemental bulkhead segment, and the third supplemental bulkhead segment is coupled to an end portion of the second supplemental bulkhead segment.

20. An organic EL display panel, comprising:
an emitting cell between two bulkheads; and
a supplemental bulkhead for connecting two bulkheads, wherein the supplemental bulkhead includes a second supplemental bulkhead segment connecting a first supplemental bulkhead segment and a third supplemental bulkhead segment, wherein a distance between the third supplemental bulkhead segment and the emitting cell is greater than a distance between the first supplemental bulkhead segment and the emitting cell, wherein a distance between an end portion of the bulkhead and the emitting cell is greater than a distance between the end portion of the third supplemental bulkhead segment and the emitting cell.

21. An organic EL display panel, comprising:
an emitting cell between two bulkheads; and
a supplemental bulkhead for connecting two bulkheads, wherein the supplemental bulkhead includes a second supplemental bulkhead segment connecting a first supplemental bulkhead segment and a third supplemental bulkhead segment, wherein a distance between the third supplemental bulkhead segment and the emitting cell is greater than a distance between the first supplemental bulkhead segment and the emitting cell, wherein the third supplemental bulkhead segment is located in a region between the end portion of the first supplemental bulkhead segment and the bulkhead.

* * * * *